(12) United States Patent
Xie et al.

(10) Patent No.: US 9,806,078 B1
(45) Date of Patent: Oct. 31, 2017

(54) FINFET SPACER FORMATION ON GATE SIDEWALLS, BETWEEN THE CHANNEL AND SOURCE/DRAIN REGIONS

(71) Applicant: GLOBALFOUNDRIES Inc., Grand Cayman (KY)

(72) Inventors: Ruilong Xie, Schenectady, NY (US); Christopher Prindle, Poughkeepsie, NY (US); Tenko Yamashita, Schenectady, NY (US); Balasubramanian Pranatharthiharan, Watervliet, NY (US); Pietro Montanini, Guilderland, NY (US); Soon-Cheon Seo, Glenmont, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/341,240

(22) Filed: Nov. 2, 2016

(51) Int. Cl.
*H01L 21/8238* (2006.01)
*H01L 29/78* (2006.01)
*H01L 27/092* (2006.01)
*H01L 21/3105* (2006.01)
*H01L 29/66* (2006.01)
(Continued)

(52) U.S. Cl.
CPC .... *H01L 27/0924* (2013.01); *H01L 21/31055* (2013.01); *H01L 21/823814* (2013.01); *H01L 21/823821* (2013.01); *H01L 21/823864* (2013.01); *H01L 29/0847* (2013.01); *H01L 29/6653* (2013.01); *H01L 29/66545* (2013.01); H01L 21/823431 (2013.01); H01L 21/823468 (2013.01); H01L 27/0886 (2013.01); H01L 29/6656 (2013.01); *H01L 29/66795* (2013.01); *H01L 29/7856* (2013.01)

(58) Field of Classification Search
CPC ..... H01L 21/823468; H01L 21/823864; H01L 21/823431; H01L 21/823821; H01L 27/0924; H01L 27/0886; H01L 29/6653; H01L 29/6656; H01L 29/66795; H01L 29/785; H01L 29/7856; H01L 29/66545
See application file for complete search history.

(56) References Cited

U.S. PATENT DOCUMENTS 7,683,428 B2 * 3/2010 Chidambarrao .. H01L 29/66787
257/302
8,110,467 B2 * 2/2012 Chang ............... H01L 29/66795
257/350
(Continued)

*Primary Examiner* — Mary Wilczewski
(74) *Attorney, Agent, or Firm* — Heslin Rothenberg Farley and Mesiti PC

(57) ABSTRACT

FinFET spacer formation includes, for example, providing an intermediate semiconductor structure having a substrate having one or more fin having a first and a second plurality of gates disposed thereon, and a first plurality of spacers disposed on sides of the first and second plurality of gates, depositing a first liner on the structure, depositing a fill material at a level along inner portions of the first liner between the gates adjacent to the one or more fin, removing outer portions of the first spacers and the first liner away from the fill material, the remaining portions of the first spacers and the first liner defining a first thickness, and depositing a second liner having a second thickness over the gates and over the remaining portions of the first spacers and the first liner, and the fill material, and wherein the first thickness is greater than the second thickness.

17 Claims, 8 Drawing Sheets

(51) Int. Cl.
*H01L 29/08* (2006.01)
*H01L 21/8234* (2006.01)
*H01L 27/088* (2006.01)

(56) References Cited

U.S. PATENT DOCUMENTS

| | | | | |
|---|---|---|---|---|
| 8,703,556 B2* | 4/2014 | Kelly | H01L 29/785 | 257/296 |
| 8,765,542 B1* | 7/2014 | Patzer | H01L 21/823828 | 257/E21.632 |
| 8,900,956 B2* | 12/2014 | Chung | H01L 21/823807 | 438/230 |
| 8,940,633 B2* | 1/2015 | Cai | H01L 29/401 | 438/608 |
| 9,105,742 B1 | 8/2015 | Basker et al. | | |
| 9,147,748 B1 | 9/2015 | Xie et al. | | |
| 9,166,010 B2* | 10/2015 | Kelly | H01L 29/0653 | |
| 9,171,927 B2 | 10/2015 | Mehta et al. | | |
| 9,276,114 B2* | 3/2016 | Colinge | H01L 29/66795 | |
| 9,318,574 B2* | 4/2016 | Cheng | H01L 29/66545 | |
| 9,330,983 B1 | 5/2016 | Cheng et al. | | |
| 9,362,407 B1 | 6/2016 | Basker et al. | | |
| 9,373,697 B2 | 6/2016 | Mehta et al. | | |
| 9,406,767 B1* | 8/2016 | Greene | H01L 29/42368 | |
| 9,443,855 B1* | 9/2016 | Devarajan | H01L 29/66545 | |
| 9,450,095 B1* | 9/2016 | Bergendahl | H01L 29/7848 | |
| 9,472,670 B1* | 10/2016 | Kambhampati | H01L 29/66545 | |
| 9,484,263 B1* | 11/2016 | Lin | H01L 21/823437 | |
| 9,530,698 B1* | 12/2016 | Basker | H01L 21/823821 | |
| 9,536,793 B1* | 1/2017 | Zhang | H01L 21/823828 | |
| 9,548,388 B1* | 1/2017 | Kambhampati | H01L 29/66545 | |
| 9,564,437 B1* | 2/2017 | Basker | H01L 21/823821 | |
| 9,564,440 B2* | 2/2017 | Cho | H01L 27/0924 | |
| 9,576,954 B1* | 2/2017 | Greene | H01L 29/42368 | |
| 9,590,103 B2* | 3/2017 | Kim | H01L 29/7848 | |
| 9,607,898 B1* | 3/2017 | Cheng | H01L 21/823431 | |
| 9,607,903 B2* | 3/2017 | Kambhampati | H01L 21/823821 | |
| 9,608,065 B1* | 3/2017 | Bergendahl | H01L 27/0886 | |
| 9,627,382 B2* | 4/2017 | Cheng | H01L 27/092 | |
| 9,634,110 B2* | 4/2017 | Greene | H01L 21/823814 | |
| 9,646,969 B2* | 5/2017 | Cho | H01L 27/0924 | |
| 9,748,146 B1* | 8/2017 | Bergendahl | H01L 21/823814 | |
| 2014/0065782 A1* | 3/2014 | Lu | H01L 29/785 | 438/294 |
| 2014/0073097 A1* | 3/2014 | Chung | H01L 21/823807 | 438/229 |
| 2014/0252424 A1* | 9/2014 | Cai | H01L 29/401 | 257/288 |
| 2014/0295637 A1 | 10/2014 | Mehta et al. | | |
| 2015/0024568 A1 | 1/2015 | Mehta et al. | | |
| 2015/0243663 A1* | 8/2015 | Hung | H01L 21/823821 | 257/365 |
| 2015/0243745 A1* | 8/2015 | Kelly | H01L 29/41766 | 257/369 |
| 2015/0243760 A1 | 8/2015 | He et al. | | |
| 2015/0249036 A1 | 9/2015 | Cai et al. | | |
| 2015/0263120 A1 | 9/2015 | Xie et al. | | |
| 2015/0287827 A1 | 10/2015 | Leobandung et al. | | |
| 2015/0318178 A1 | 11/2015 | Pham et al. | | |
| 2015/0333136 A1 | 11/2015 | Xie et al. | | |
| 2015/0380514 A1 | 12/2015 | Bentley et al. | | |
| 2016/0064379 A1* | 3/2016 | Yu | H01L 21/0223 | 257/192 |
| 2016/0365450 A1* | 12/2016 | Cho | H01L 27/0924 | |
| 2017/0040224 A1* | 2/2017 | Kambhampati | H01L 29/66545 | |
| 2017/0040325 A1* | 2/2017 | Kambhampati | H01L 29/66545 | |
| 2017/0040453 A1* | 2/2017 | Kambhampati | H01L 29/66545 | |
| 2017/0047257 A1* | 2/2017 | Han | H01L 21/823431 | |
| 2017/0062427 A1* | 3/2017 | Basker | H01L 21/823821 | |
| 2017/0069541 A1* | 3/2017 | Basker | H01L 21/823821 | |
| 2017/0069631 A1* | 3/2017 | Basker | H01L 21/823821 | |
| 2017/0084712 A1* | 3/2017 | Greene | H01L 29/42368 | |
| 2017/0103984 A1* | 4/2017 | Ok | H01L 27/0924 | |
| 2017/0141210 A1* | 5/2017 | Yang | H01L 21/823431 | |
| 2017/0170301 A1* | 6/2017 | Devarajan | H01L 29/66795 | |
| 2017/0229350 A1* | 8/2017 | Bergendahl | H01L 21/823814 | |

* cited by examiner

US 9,806,078 B1

FINFET SPACER FORMATION ON GATE SIDEWALLS, BETWEEN THE CHANNEL AND SOURCE/DRAIN REGIONS

TECHNICAL FIELD

The present disclosure relates generally to semiconductor structures, and more particularly to finFET spacer formation on gate sidewalls, between the channel and source/drain regions.

BACKGROUND OF THE DISCLOSURE

Fin field-effect transistor (FinFET) devices continue to be developed to replace conventional planar metal oxide semiconductor field-effect transistors (MOSFETs) in advanced complementary metal oxide semiconductor (CMOS) technology. As is known, the term "fin" refers to a generally vertically-oriented structure within or upon which are formed, for instance, one or more FinFETs or other fin devices, such as passive devices, including capacitors, diodes, etc.

SUMMARY OF THE DISCLOSURE

The shortcomings of the prior art are overcome and additional advantages are provided through the provision of a method which includes, for example, providing an intermediate semiconductor structure having a substrate having one or more fin having a first plurality and a second plurality of gates disposed thereon, and a first plurality of spacers disposed on sides of the first plurality and the second plurality of gates, depositing a first liner on the intermediate semiconductor structure, depositing a fill material at a level along inner portions of the first liner between the first plurality and second plurality of gates adjacent to the one or more fin, removing outer portions of the first spacers and the first liner away from the fill material, the remaining portions of the first spacers and the first liner disposed adjacent to the one or more fin defining a first thickness, and depositing a second liner having a second thickness over the first plurality and the second plurality of gates and over the remaining portions of the first spacers and the first liner, and the fill material, and wherein the first thickness is greater than the second thickness.

In another aspect, a semiconductor structure includes, for example, one or more fin, a first plurality of gates disposed over the one or more fin, a second plurality of gates disposed over the one or more fin, first lower spacers having first thickness disposed over lower side portions of the first plurality of gates, second lower spacers having a second thickness disposed over lower side portions of the second plurality of gates, the second thickness being equal to the first thickness, first upper spacers disposed over upper side portions of the first plurality of gates, second upper spacers disposed over upper side portions of the second plurality of gates, first source/drain regions disposed on the fin adjacent to the first lower spacers operable for forming nFETs, and second source/drain regions disposed on the fin adjacent to the second lower spacers operable for forming pFETs.

Additional features and advantages are realized through the techniques of the present disclosure. Other embodiments and aspects of the present disclosure are described in detail herein and are considered a part of the claims.

BRIEF DESCRIPTION OF THE DRAWINGS

The subject matter of the present disclosure is particularly pointed out and distinctly claimed in the concluding portion of the specification. The disclosure, however, may best be understood by reference to the following detailed description of various embodiments and the accompanying drawings in which:

DETAILED DESCRIPTION OF THE DISCLOSURE

The present disclosure and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the disclosure in detail. It should be understood, however, that the detailed description and the specific examples, while indicating embodiments of the present disclosure, are given by way of illustration only, and are not by way of limitation. Various substitutions, modifications, additions and/or arrangements within the spirit and/or scope of the underlying concepts will be apparent to those skilled in the art from this disclosure. Reference is made below to the drawings, which are not drawn to scale for ease of understanding, wherein the same reference numbers used throughout different figures designate the same or similar components.

The present disclosure is directed to formation of offset spacers between source/drain regions and a channel such as formation of spacers between a gate and source/drain regions. As described in greater detail below, the spacers may be equal sized spacers, and may include equal sized spacers along gate sides in nFETs and pFETs. In addition, the present disclosure may provide decreased sized spacers between adjacent gates allowing decreasing the pitch between the gates. Such decreased sized spacers may allow improving the process margin such as during intervening process steps.

For example, for advanced finFET technology, gate pitch may be significantly reduced, while maintaining spacer thickness requirements between source/drain and channel regions. In order to obtain a particular final spacer thickness, it may be needed to form thicker spacer during intermediate steps, to compensate for downstream spacer losses. As will be appreciated from the following description, the present disclosure overcomes the problem of forming a thick spacer at such tight gate pitch (which otherwise is easily pinch-off during spacer deposition), and overcomes the problem of performing further CMOS patterning include OPL fill and etch processes with a narrow reduced space between the spacers.

FIGS. 1-19 diagrammatically illustrate methods for forming spacers between gates for use in forming sources/drains in nFETs and pFETs according to embodiments of the present disclosure.

Figure 1:
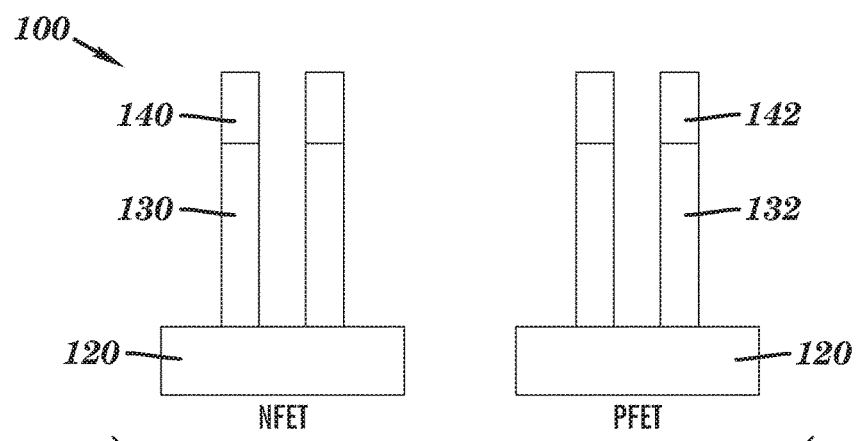
FIGS. 1-19 are cross-sectional views of intermediate semiconductor structures diagrammatically illustrating methods for forming spacers between gates for use in forming sources/drains in nFETs and pFETs according to embodiments of the present disclosure.

FIG. 1 illustrates a cross-sectional view of an intermediate semiconductor structure 100 having, for example, one or more fin 120 disposed on the substrate such as a bulk semiconductor substrate (not shown). A first plurality of gates 130 is disposed on fin 120 and a plurality of hard masks 140 is disposed on gates 130. A second plurality of gates 132 is disposed on fin 120 and a plurality of hard masks 142 is disposed on gates 132. The bulk semiconductor substrate and fin 120 may be operable for forming, as described below, nFET structures and pFET structures such as transistors. It will be appreciated that the process may include first forming the nFET structures, then the pFET structures, or vice-versa. As one skilled in the art will understand, where, as in the present example, a semiconductor material is used, many fins and gates may be formed, is repeated a large number of times across the substrate such as a wafer.

Plurality of patterned hard masks 140 and 142 such as SiBCN may be formed from a first hard mask layer using conventional lithography and etching techniques. Patterned hard masks 140 and 142 may be used, for example, in forming gates 130 and 132 from an amorphous silicon layer such as employing a reactive ion etching (ME) of the amorphous silicon layer. The plurality of gates may be "dummy" gates, in that they may be later removed and replaced with metal gates in a replacement gate process. In other embodiments, the intermediate semiconductor structure may include metal gates. Fin 120 may be formed from silicon or any semiconductor material including, but not limited to, silicon (Si), germanium (Ge), a compound semiconductor material, a layered semiconductor material, a silicon-on-insulator (SOI) material, a SiGe-on-insulator (SGOI) material, and/or a germanium-on-insulator (GOI) material, or other suitable semiconductor material or materials.

Figure 2:
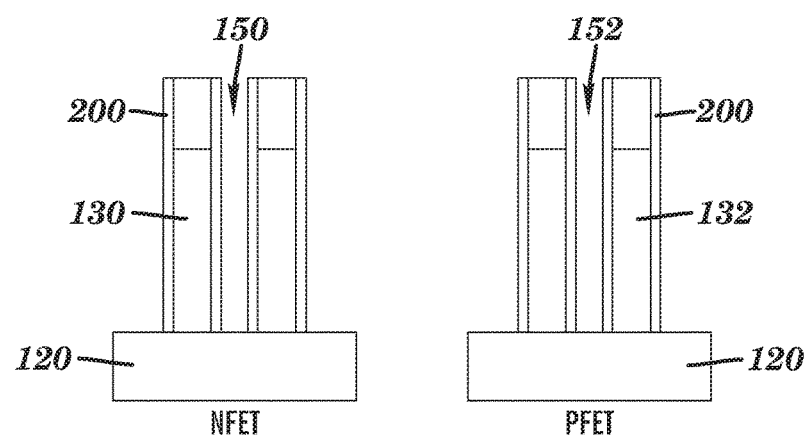

As shown in FIG. 2, a first spacer 200 is disposed on the sides of gates 130 and 132. For example, a first layer such as a SiN layer may be disposed over intermediate structure 100 (FIG. 1). A removal process such as a reactive ion etching (ME) process is performed on the first layer to form first spacers 200 on the sides of gates 130 and hard masks 140 on fin 120, and to form first spacers 200 on the sides of gates 132 and hard masks 142 on fin 120, as shown in FIG. 2. The plurality of first spacers 200 disposed on sides of gates 130 may define first cavities 150 between first spacers 200 on the first plurality of gates. The plurality of first spacers 200 disposed on sides of gates 132 may define first cavities 152 between the first spacers 200 on the second plurality of gates 132.

Figure 3:
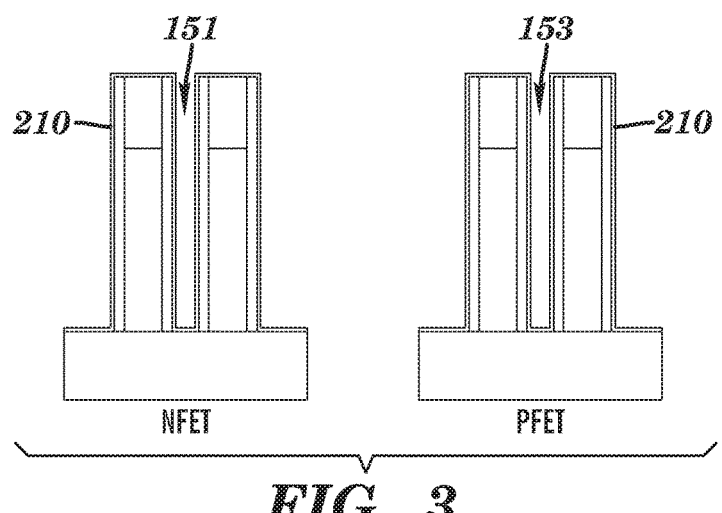

As shown in FIG. 3, a first liner 210 such as SiN is deposited on the structure of FIG. 2. First liner 210 may define cavities 151 between portions of the first liner on the first plurality of gates 130. First liner 210 may define cavities 153 between portions of the first liner on the second plurality of gates 132.

In other embodiments, the hard masks may be SiBCN, and the spacer and liner materials may be SiOCN. In still other embodiments, hard masks may be SiN, and the spacer and liner materials may be SiOCN. With reference to FIGS. 2 and 3, if target spacers having a thickness of about 7.5 nanometers desired, a first spacer may be deposited having a thickness of about 5 nanometers, which is followed by a first liner having a thickness of about 2.5 nanometers.

Figure 4:
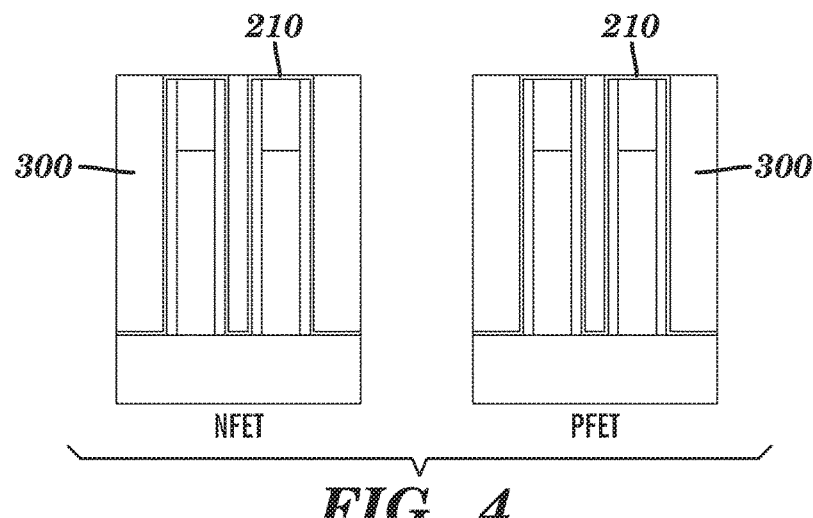

With reference to FIG. 4, a fill material such as an oxide layer may be deposited on the structure of FIG. 3 such as a local STI fill and chemical mechanical polished (CMP) resulting in fill material 300 disposed between the spacers such as in cavities 151 (FIG. 3) and cavities 153 (FIG. 3). The CMP may be stopped at the thinner nitride liner, e.g., across the uppermost portion of second liner 210.

Figure 5:
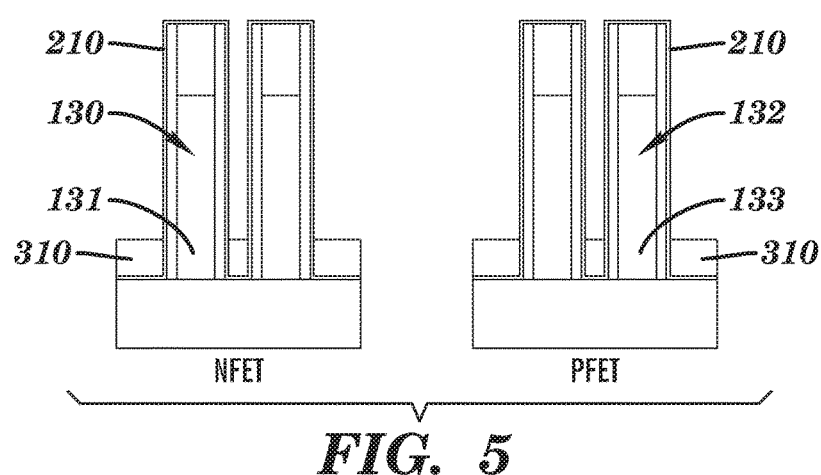

FIG. 5 illustrates a partial fill material removal process such as an etching resulting in a fill material 310 disposed along lower portions 131 of gates 130, and along lower portions 133 of gates 132. A top portion of fill material 300 (FIG. 4) is etched back between the gates, such as using a wet etching such as a buffered hydrogen fluoride (BHF) wet etching.

Figure 6:
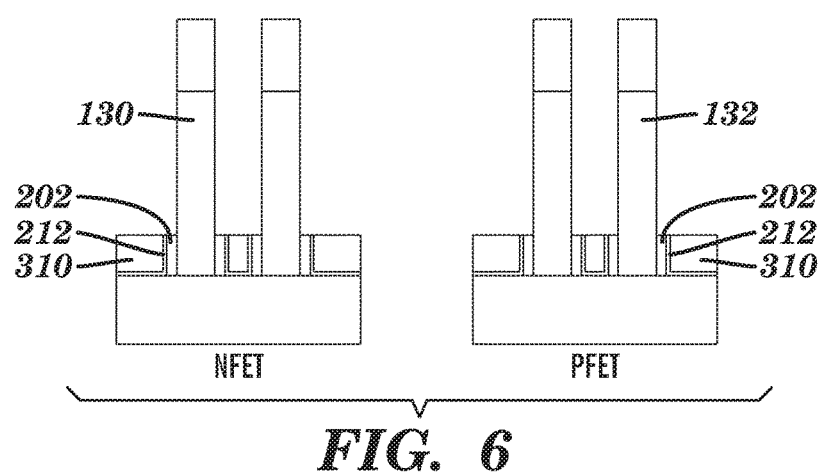

As shown in FIG. 6, upper portions of spacer 200 and liner 210 in FIG. 5 are removed resulting in spacers 202 and liner 212 disposed adjacent to the intersection of the fin and the gates. For example, removal of the top portion of first spacer 200 (FIG. 5) and top portion of liner 210 (FIG. 5) is removed such as using a HFEG solution. In embodiments where the hard mask is SiBCN and spacer and liner materials are SiOCN, removal may employ HF.

Figure 7:
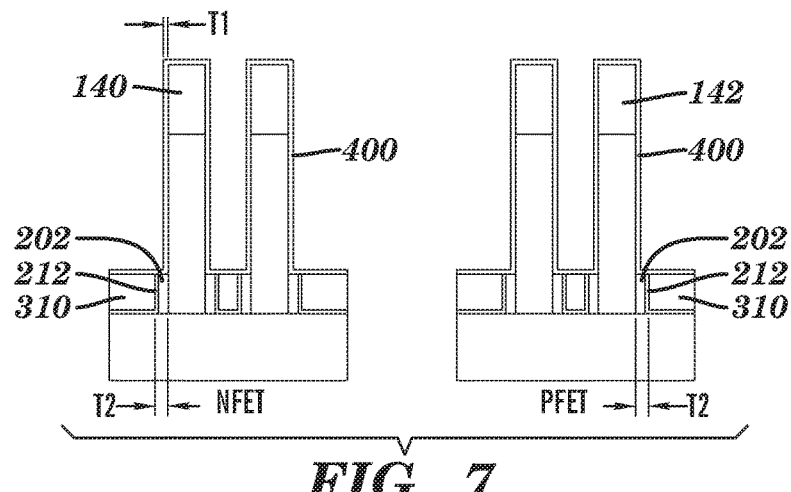

As shown in FIG. 7, a second liner 400 is deposited over the structure shown in FIG. 6. For example, a liner such as a SiBCN liner is deposited over spacers 202 and liner 212, fill material 310, the sides of gates 130 and 132, and over hard masks 140 and 142.

As will be appreciated from the description below, spacer 202 and liner 212 together form a spacer at the intersection of the gates and the fin having a thickness T2 that is greater than liner 400 having a thickness T1.

FIGS. 8-19 diagrammatically illustrate a process for forming nFETS and pFETS using the intermediate structure of FIG. 7.

Figure 8:
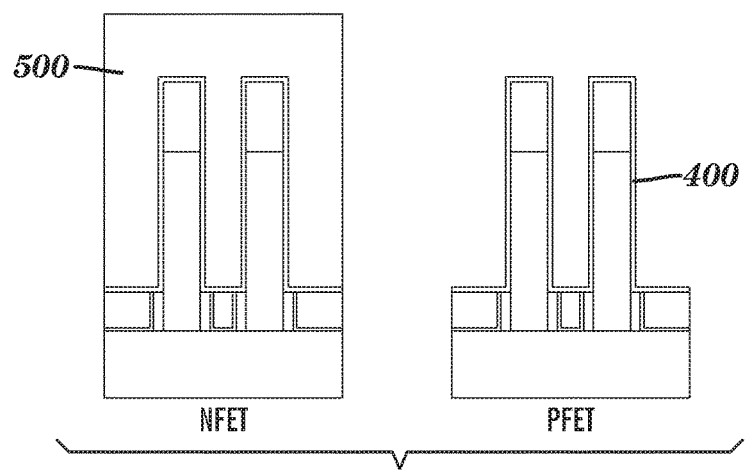

With reference to FIG. 8, an optical planarization layer (OPL) 500 may be deposited over a portion of the structure for later forming nFETs in order to mask the nFETs during processing of the pFETs. For example, OPL 500 may be deposited over the structure for forming both the nFETs and the pFETs, and then photolithography and etched to open the structure for forming the pFETs, as shown in FIG. 8, while keeping the portions of the structure for forming the nFETs covered.

Figure 9:
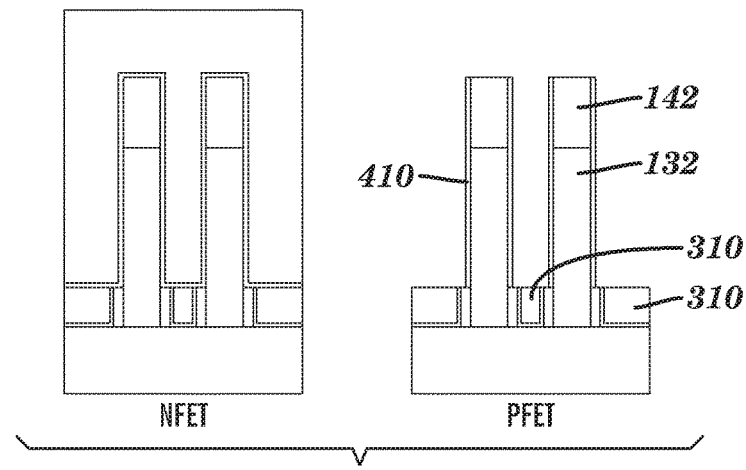
Figure 10:
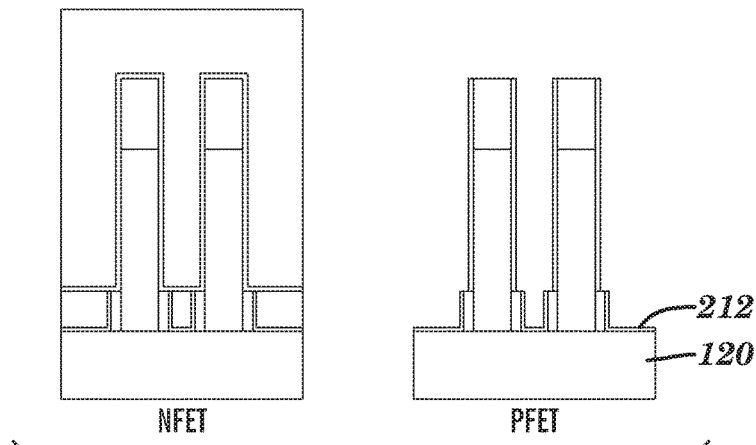
Figure 11:
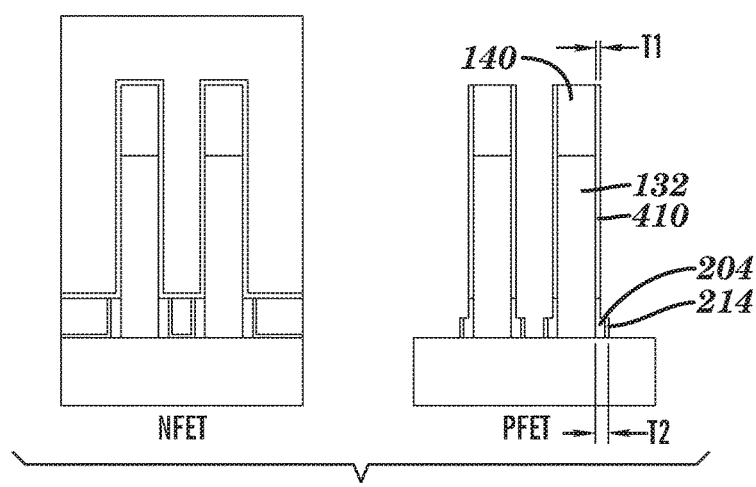

As shown in FIG. 9, horizontal portions of liner 400 (FIG. 8) on the structure for forming pFETs may be etched and removed such as by an SIBCN anisotropic etch to form spacers 410 disposed along upper side portions of gates 132 and hard masks 142. An oxide etch back may be performed on the structure for forming pFETs in FIG. 9 to remove fill material 310 as shown in FIG. 10. Horizontal portions of the remaining thin nitride liner 212 along fin 120 is etched back as shown in FIG. 11 to form spacer 204 and liner 214 disposed at the intersection of the gates and the fin. As will be appreciated, the combined remaining spacer and liner thickness may be anchored and not impacted by the patterning process for separately protecting and exposing the portions of the structure for forming the pFETs and nFETs. In addition, remaining spacer 204 and liner 214 effectively form a spacer at the intersection of the gates and the fin having a thickness T2 that is greater than spacer 410 having a thickness T1 disposed over the remaining sides of gates 132 and hard masks 142.

Figure 12:
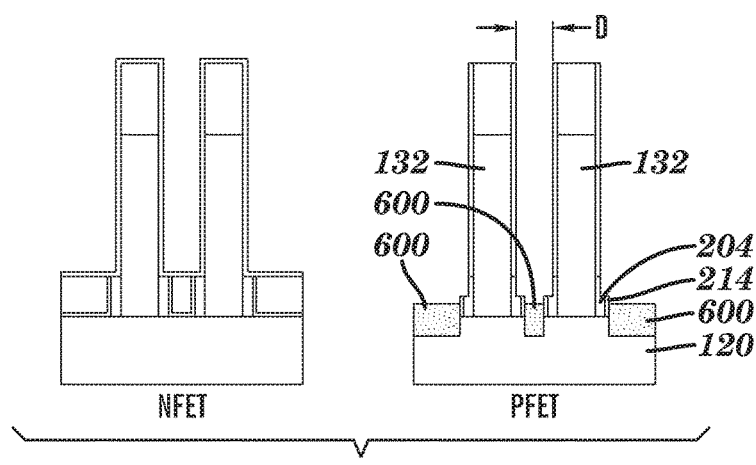

As shown in FIG. 12, optical planarization layer 500 is removed or stripped from the structure of FIG. 11. Thereafter, pFET epitaxial growth 600 may be performed on fin 120 between gates 132. For example, a removal process such as a substrate etch may be performed to define recesses in fin 120 between spacers 204 and liner 214. Such a removal process may be an anisotropic etch such as an anisotropic dry etch that vertically etches into fin 120 to form the recesses. pFET epitaxial growth 600 may be disposed in the recesses. The pFET epitaxial growth may be a boron doped SiGe disposed at a temperature of about 600 degrees Celsius to about 700 degrees Celsius.

Figure 13:
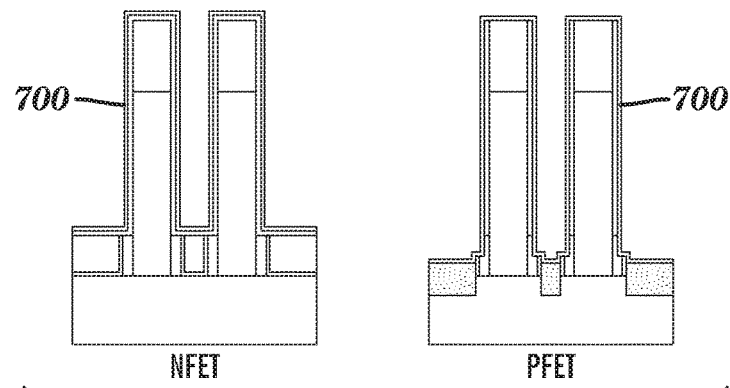

As shown in FIG. 13, a third liner 700 such as SiBCN is deposited on the pFETS, and the portions of the structure for forming nFETs.

Figure 14:
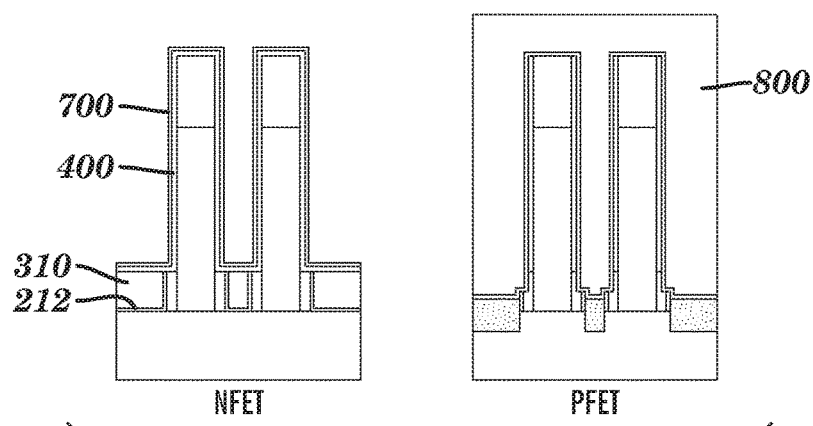

With reference to FIG. 14, an optical planarization layer (OPL) 800 may be deposited over a portion of the structure for forming pFETs in order to mask the pFETs during processing of nFETs. For example, OPL 800 may be deposited over the structure for forming both the nFETs and the formed pFETs, and then photolithography and etched to open the structure for forming the nFETs, as shown in FIG. 14, while keeping the portions of the structure with the formed pFETs covered.

Figure 15:
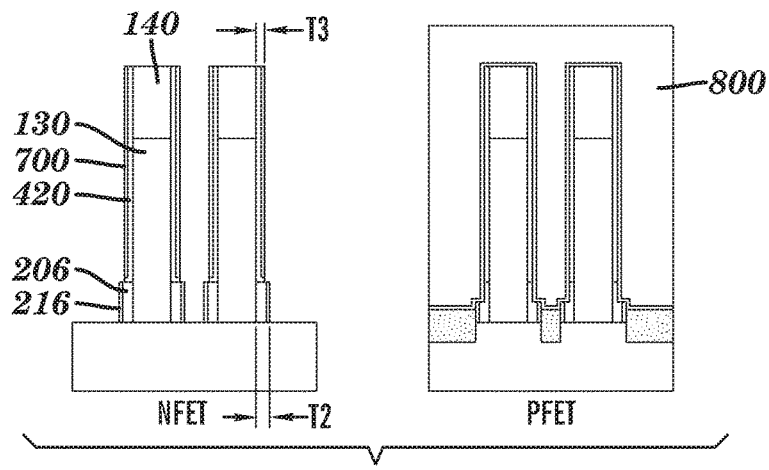

As shown in FIG. 15, horizontal portions of third liner 700 (FIG. 14) disposed over the portion of the structure (of FIG. 14) for forming nFETs is removed leaving spacers 720. Horizontal portions of liner 400 (FIG. 14) on the structure for forming nFETs may be etched and removed such as by an SIBCN anisotropic etch to form spacers 420 disposed along upper side portions of gates 130 and hard masks 140. An oxide etch back may be performed on the structure for forming nFETs to remove fill material 310 (FIG. 14). Horizontal portions of the thin remaining nitride liner 212 (FIG. 14) along fin 120 is etched back as shown in FIG. 15 to form spacer 206 and spacer 216 disposed at the intersection of the gates and the fin. As will be appreciated, the spacer thickness may be anchored and not impacted by the patterning process for separately protecting and exposing the portions of the structure for forming the nFETs. In addition, spacer 206 and spacer 216 forms a spacer at the intersection of the gates and the fin having a thickness T2 that is greater than spacer 420 and spacer 720 disposed having a thickness T3 disposed over the remaining sides of gates 130 and hard masks 140. Optical planarization layer 800 is then removed or stripped from the structure of FIG. 15.

Figure 16:
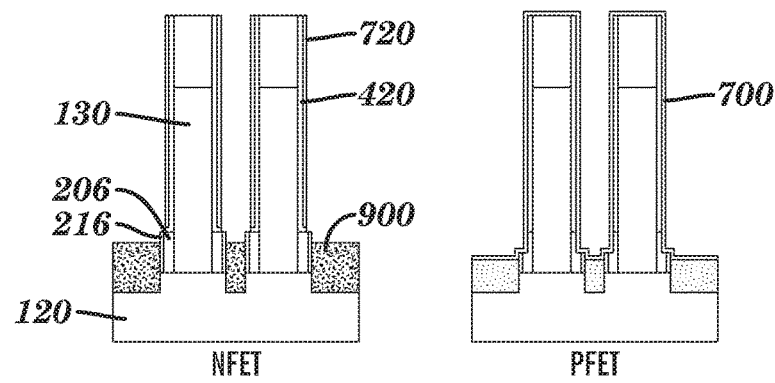

As shown in FIG. 16, nFET epitaxial growth 900 may be performed on fin 120 between gates 130. For example, a removal process such as a substrate etch may be performed to define recesses in fin 120 between spacers 206 and 216. Such a removal process may be an anisotropic etch such as an anisotropic dry etch that vertically etches into fin 120 to form the recesses. nFET epitaxial growth 900 may be disposed in the recesses. The nFET epitaxial growth may be a phosphorus doped Si disposed at a temperature of about 600 degrees Celsius to about 700 degrees Celsius.

Figure 17:
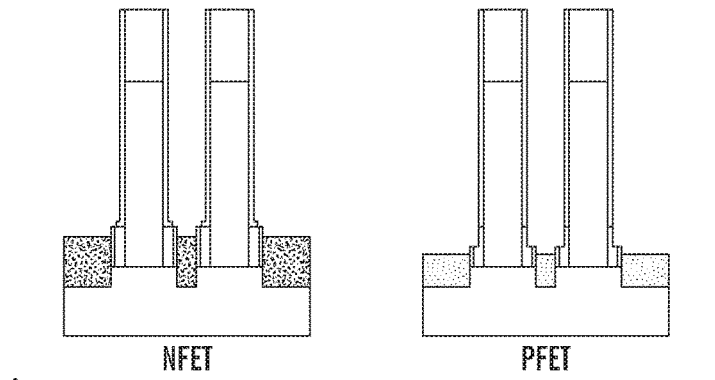

With reference to FIG. 17, a removal process is performed to remove liner 720 (FIG. 16) and liner 700 (FIG. 16). Such a removal process may be a HFEG solution removal.

Figure 18:
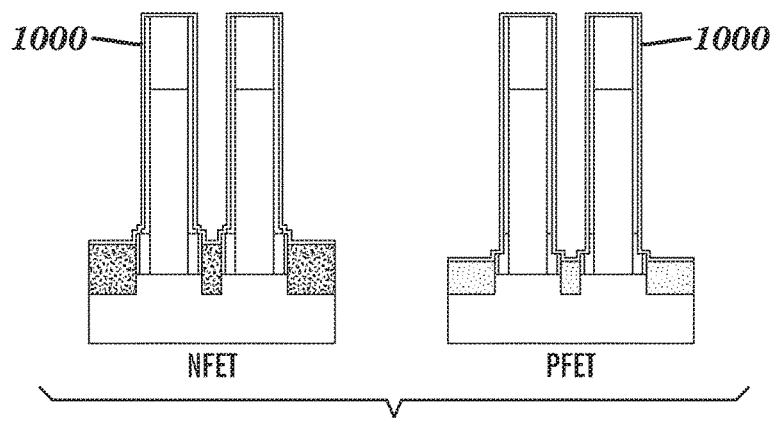
Figure 19:
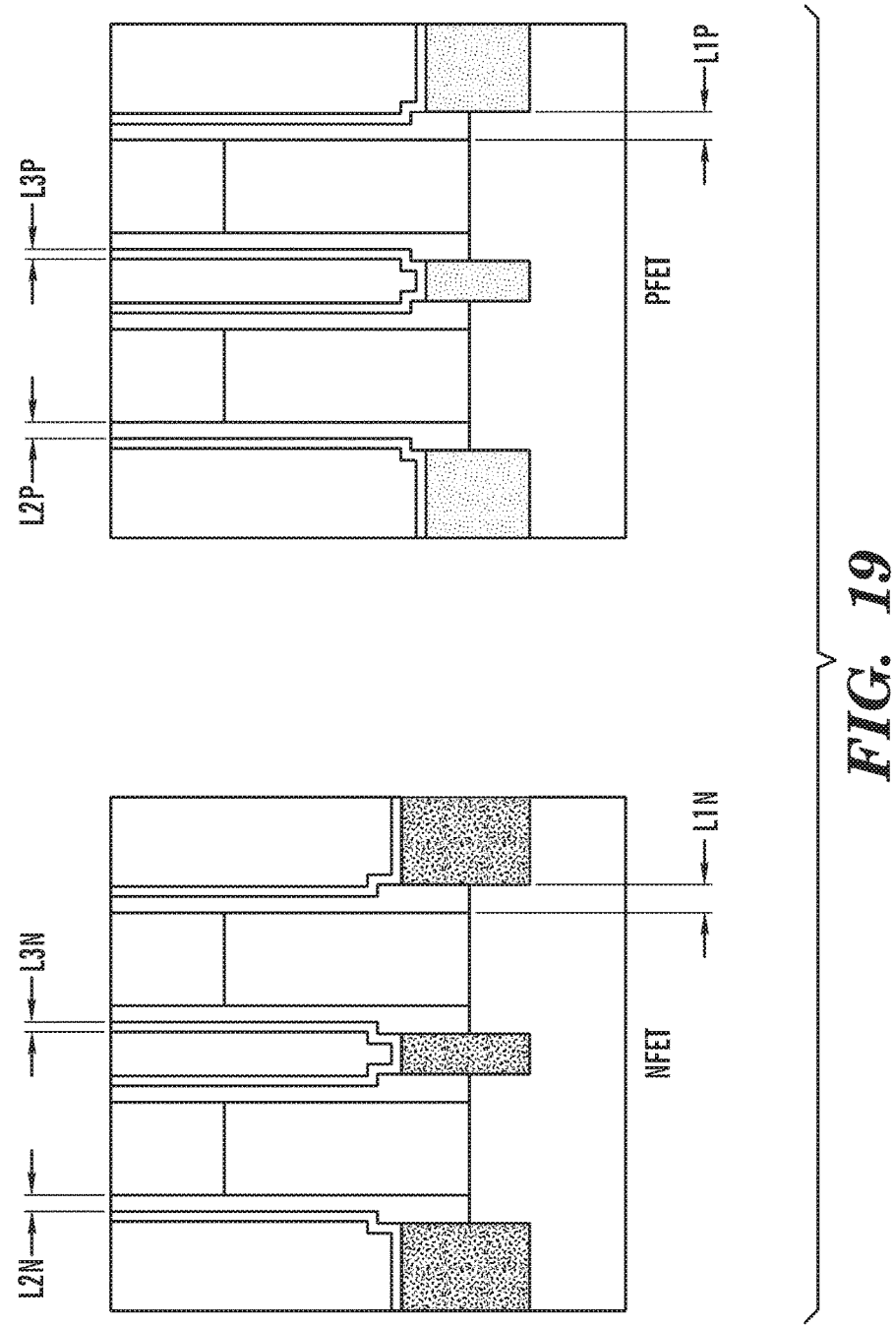

As shown in FIG. 18, a fourth liner 1000 is deposited over the structure of FIG. 17. For example, a SiN, SiBCN, or SiOCN liner may be deposited. After downstream processing through replacement metal gate (RMG), the resulting structure is shown in FIG. 19.

In the various embodiments, for example, equal spacers may be provided in the pFETS and in the nFETs. For example, L1N=L1P and the material may be SiOCN, SiN, or SiBCN. L2N=L2P and the material may be SiBCN. L3N=L3P and the material may be SiBCN or SiN.

Figure 20:
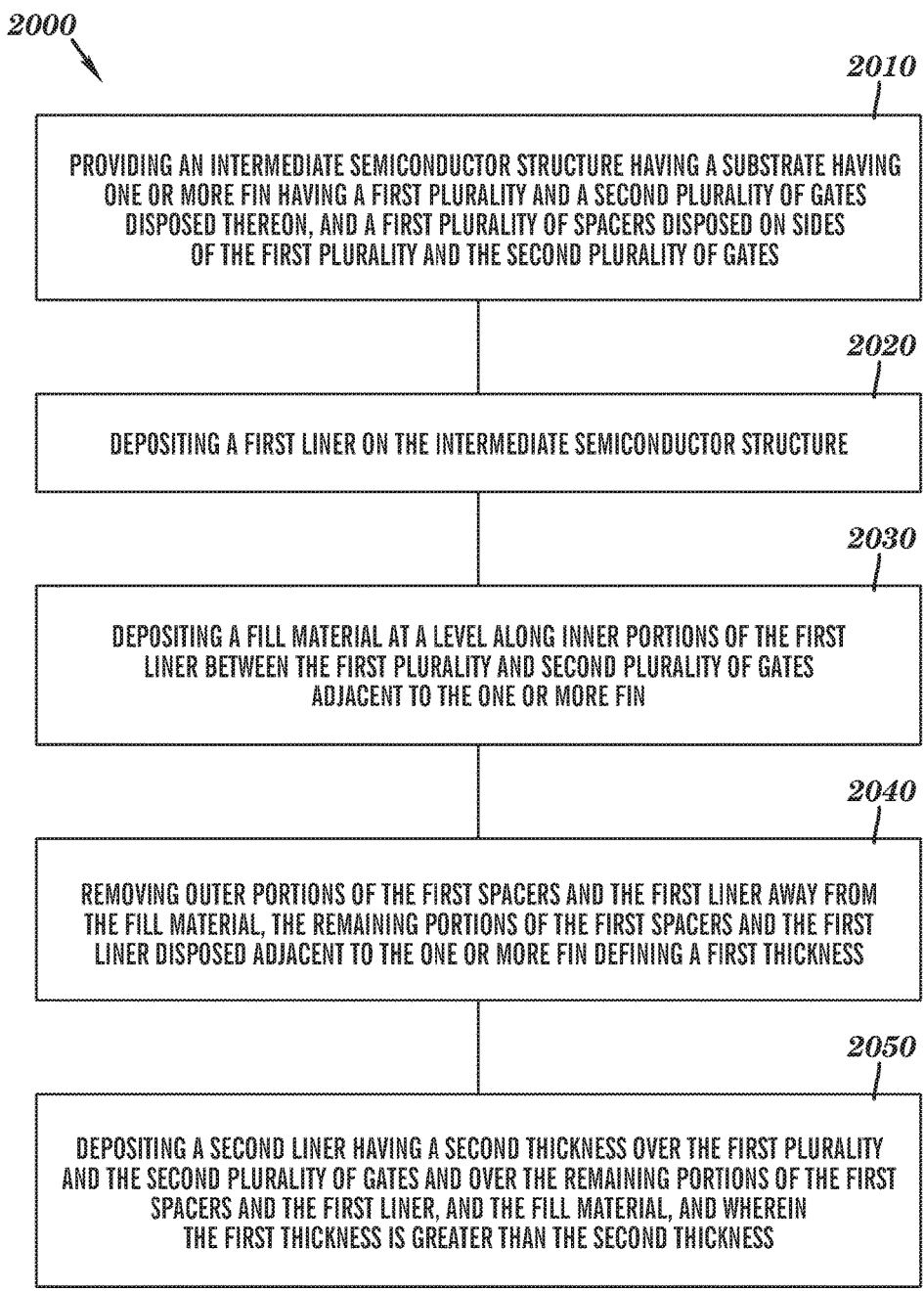
FIG. 20 is a flowchart illustrating a method for forming spacers between gates for use in forming sources/drains in nFETs and pFETs according to embodiments of the present disclosure.

FIG. 20 illustrates a flowchart of a method 2000 for forming spacers for use between gates in forming sources/drains such as for nFETs and pFETs according to an embodiment of the present disclosure. Method 2000 may include at 2010 providing an intermediate semiconductor structure with a substrate having one or more fin having a first plurality and a second plurality of gates disposed thereon, and a first plurality of spacers disposed on sides of the first plurality the second plurality of gates. At 2020 a first liner is deposited on the intermediate semiconductor structure. At 2030 a fill material is deposited at a level along inner portions of the first liner between the first plurality and second plurality of gates adjacent to the one or more fin. At 2040 outer portions of the first spacers and the first liner are removed away from the fill material, the remaining portions of the first spacers and the first liner disposed adjacent to the one or more fin defining a first thickness. At 2050 a second liner having a second thickness is deposited over the first plurality and the second plurality of gates and over the remaining portions of the first spacers and the first liner, and the fill material, and wherein the first thickness is greater than the second thickness.

It will be appreciated that the present disclosure may provide a better cut margin, better taper device compatibility compared to a conventional "fin cut first" process. The present disclosure may provide a more uniform fin height and no loading effect compared to a conventional "fin cut last" process. The present disclosure may avoid the problems last fin taper and fin reveal loading effect typically resulting from a "fin cut first" process, and may avoid the problem in the "fin cut last" process of only compatible with fin cut last.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of one or more aspects of the present disclosure and the practical application, and to enable others of ordinary skill in the art to understand one or more aspects of the disclosure for various embodiments with various modifications as are suited to the particular use contemplated.

The invention claimed is:
1. A method comprising:
providing an intermediate semiconductor structure comprising a substrate having one or more fin having a first plurality and a second plurality of gates disposed thereon, and a first plurality of spacers disposed on sides of the first plurality and the second plurality of gates;

depositing a first liner on the intermediate semiconductor structure;

depositing a fill material at a level along inner portions of the first liner between the first plurality and second plurality of gates adjacent to the one or more fin;

removing outer portions of the first spacers and the first liner away from the fill material, the remaining portions of the first spacers and the first liner disposed adjacent to the one or more fin defining a first thickness; and depositing a second liner having a second thickness over the first plurality and the second plurality of gates and over the remaining portions of the first spacers and the first liner, and the fill material, and wherein the first thickness is greater than the second thickness.

2. The method of claim 1 wherein the depositing the fill material comprises depositing the fill material over the first liner and above the first plurality and the second plurality of gates, and removing a portion of the fill material to the level along inner portions of the first liner.

3. The method of claim 2 wherein the removing the portion of the fill material comprises first removing a portion of the fill material stopping at the first liner above the first plurality and the second plurality of spaced apart gates.

4. The method of claim 3 wherein the first removing comprises a chemical mechanical polishing.

5. The method of claim 3 wherein the removing the portion of the fill material comprises a second removing of a portion of the fill material to the level along inner portions of the first liner.

6. The method of claim 1 further comprising:
depositing a first blocking material over the second liner disposed on the first plurality of gates; and
removing a portion of the second liner, the fill material, and the first liner disposed between the second plurality of gates to expose portions of the one or more fin between the second plurality of gates.

7. The method of claim 6 wherein the removing the portion of the second liner comprises anisotropically removing the second liner disposed between the second plurality of gates, and the removing the first liner comprises anisotropically removing the first liner disposed between the second plurality of gates.

8. The method of claim 7 further comprising removing the first blocking material.

9. The method of claim 8 further comprising:
forming source/drain regions on the one or more fin adjacent to the remaining first spacers and first liner between the second plurality of gates.

10. The method of claim 9 further comprising depositing a third liner over the first plurality and second plurality of gates.

11. The method of claim 10 further comprising
depositing a second blocking material over the third liner disposed on the second plurality of gates; and
removing a portion of the third liner, the second liner, the fill material, and the first liner disposed between the first plurality of gates to expose portions of the one or more fin between the first plurality of gates.

12. The method of claim 11 further comprising:
removing the second blocking material; and
forming source/drain regions on the one or more fin adjacent to the remaining first spacers and first liner between the first plurality of gates.

13. The method of claim 12 further comprising:
removing the remaining third liner.

14. The method of claim 12 wherein the first plurality of gates and first source/drain regions are operable for forming nFETS, and the second plurality of gates and second source/drain regions are operable for forming pFETS.

15. The method of claim 12 wherein the remaining first spacers and first liner between the first plurality of gates and between the second plurality of gates have equal thicknesses.

16. The method of claim 13 further comprising:
depositing a fourth liner on and between the first plurality of gates, and on and between the second plurality of gates.

17. The method of claim 1 wherein the first and second plurality of gates comprise dummy gates.

* * * * *